United States Patent [19]

Goss

[11] 3,993,821

[45] Nov. 23, 1976

[54] METALLIZATION OF BERYLLIA COMPOSITES

[75] Inventor: Bruce R. Goss, Hixson, Tenn.

[73] Assignee: Minnesota Mining and Manufacturing Company, St. Paul, Minn.

[22] Filed: Dec. 23, 1974

[21] Appl. No.: 535,566

[52] U.S. Cl. .............................. 428/208; 106/20; 427/96; 427/123; 427/282; 427/376 B; 428/209; 428/210; 428/472; 428/538; 428/901; 428/457

[51] Int. Cl.² ............... B32B 3/00; B05D 5/12; C09D 11/00; B32B 15/04

[58] Field of Search .......... 428/204, 208, 209, 210, 428/457, 538, 901, 472; 427/282, 123, 96, 377, 376; 106/20

[56] References Cited

UNITED STATES PATENTS

| | | | |
|---|---|---|---|
| 2,902,756 | 9/1959 | Cavanaugh | 427/123 |
| 2,903,788 | 9/1959 | Pryslak | 427/123 |
| 3,537,888 | 11/1970 | Schwyn | 427/376 |
| 3,565,684 | 2/1971 | Buck | 427/123 |
| 3,620,799 | 11/1971 | Hoelscher et al. | 427/377 |
| 3,681,135 | 8/1972 | Cheary | 428/210 |

OTHER PUBLICATIONS

"Molybdenum Metalizing on Beryllia" Ceramic Bulletin, vol. 53, No. 6 (1974), pp. 473–477.

Primary Examiner—Harold Ansher
Assistant Examiner—William R. Dixon, Jr.
Attorney, Agent, or Firm—Alexander, Sell, Steldt & Delahunt

[57] ABSTRACT

Metallization for application to green unfired beryllia ceramics and for cofiring therewith either in single or multilayer laminates is provided by combining and milling 5 to 30 and preferably 15–25 weight percent of beryllia with a metal such as molybdenum or tungsten or combinations thereof in amount to total 100% using small amounts of conventional vehicles.

6 Claims, No Drawings

METALLIZATION OF BERYLLIA COMPOSITES

This invention relates to metallization for beryllia and particularly to metallization that can be applied to green beryllia substrates and subsequently cofired therewith in single or multilayer laminates.

Ceramics of high purity beryllia, that is 97% or more BeO, are advantageous for many purposes because of the excellent heat conductivity of the material which even outweighs the serious problems attendant on operating with beryllia through the various ceramic processes. It is well-known that beryllia as a finely divided material is very poisonous and the effects are persistent. It will be understood herein that all operations described with respect to the use of beryllia as powdered material must be carried out with scrupulous care to avoid inhalation of the dust or contamination of the body by the dust by any other methods, such as open cuts, scratches, orally, etc.

Uses of beryllia, i.e., beryllium oxide, for electronic purposes commonly require the use of conductors, terminals, exposed or buried leads and other such metallized patterns as are more conventionally used with alumina articles. Although metallizing compositions are commonly used with alumina articles, almost all commercial materials contain greater or less amounts of glass which assists in bonding the metal to the substrate. This is the case whether the metal is tungsten or molybdenum-manganese, gold, palladium, platinum or silver, all of which may be used under suitable conditions. Limitations are introduced by cofiring the metallizing and alumina because certain metals melt below the temperature at which high purity alumina is matured to a hard, dense ceramic. Thus, in order to be able to cofire palladium and alumina, ink containing 4.5–17% of a special type of alumina is incorporated with 65–80% palladium and 15–20% vehicle for use on alumina substrates of the same special composition as described by Theobald and Bailey, U.S. Pat. No. 3,723,176.

According to U.S. Pat. No. 3,637,435, prefired beryllia substrates have been screen printed with an ink containing refractory metal and beryllium metal which later is oxidized during refiring.

A rather different and quite serious problem from those encountered in the above instances is introduced when cofiring of beryllia with conventional metallizations is attempted because any glassy binder employed appears to be soaked up by capillarity into the structure itself and away from the metal-ceramic interface before the ceramic matures, thus leaving the metal itself without appreciable glassy binder. Under such conditions, there usually results very low adhesion of the metal to the substrate and unsatisfactory products are obtained. There is accordingly a need for a method of providing good adherence of metallizing to high purity beryllia substrates of one or more layers.

It is an object of this invention to provide metallizing compositions cofirable with green beryllia ceramics to give adherent metallization. Another object of the invention is to provide high purity beryllia composites of one or more layers having adherent metallization. Other objects will become evident herein.

In accordance with these and other objects, it has been found that the incorporation of relatively low weight percentages of high purity beryllia in metallizing compositions results in co-maturation of the beryllia of the substrate and of the metallization and effects good adhesion of the metallization.

The beryllia should be approximately the same purity and particle size range as used for the substrate which can be either compressed from dry powder or formed using an organic binder as described in Park, U.S. Pat. No. 2,966,719 to thicknesses of from about 0.1 to 1 mm. The beryllia is ball milled with the metal powder in acetone in porcelain mills for 24 hours. The metal is one of the conventional refractory metallizing metals, molybdenum or tungsten. The acetone is evaporated to give a cake which is broken up to give particles of less than 0.8 to 1 mm. diameter. These particles are dispersed in conventional silk-screening vehicles, such as a terpineol solution of ethyl cellulose, to give inks containing 70–90% of solids by weight. Silk screening is by conventional procedures and firing is in a reducing atmosphere when oxidizable metals are employed. The composition of the ink may thus be approximately 35 to 27% BeO, 49–86% W or Mo and 10–30% vehicle.

The invention is more fully illustrated by the following examples which further show how adhesion of the metallization is determined. It must be remembered as noted above that all operations in which there is chance for contamination of the environment or by contact by operators with beryllia dust are conducted with utmost care to avoid such possible contamination or contact.

EXAMPLE 1

A printing ink containing 20% BeO by weight is prepared by milling together in a porcelain ball mill for 24 hours a charge of 80 g. tungsten powder (average particle size about 2.7 microns, available by blending and milling together several sizes obtained from Sylvania Electric Co.), 20 g. beryllia (99.5% purity, average size 2.5 microns) and 60 ml. acetone. The slurry is evaporated in a glass tray to give a cake which is broken up with a porcelain mortar and pestle and screened to pass about 0.8 mm. diameter holes. To 6 g. of a 5% ethyl cellulose solution in terpineol as vehicle are added 24 g. of the screened powder and the mixture is thoroughly dispersed by spatulation and passing over the rolls of a 3-roll dispersion mill several (2–6) times. The resulting composition is an ink having the properties of flow, etc. necessary for silk-screening.

Green beryllia ceramic 0.5 mm. thick is prepared using an organic binder, for example, as described in U.S. Pat. No. 2,966,719 and a pattern of various conductive paths, interconnects, etc. including terminals, as test pads, about 2.5 mm. square is screened on it using the ink prepared above to give a metallization coating about 0.02 mm. thick. Insulative layers may be screened over parts which should be protected using an ink prepared from BeO without metal. Patterns of this type, i.e., with conductive paths, interconnects, terminals, etc., are employed in electronic packaging applications. When high thermal dissipation is necessary, the patterns are advantageously applied to beryllia substrates as in these test pieces. Although several pieces comprising different patterns may be laminated together to form a monolithic structure for particular uses, test pieces may be of only one layer for convenience. The parts are fired in a periodic kiln in a reducing atmosphere (dissociated ammonia) for 2 hours at 1625° C. heating at a rate of 200° C. per hour. After cooling the ceramic pieces, they are nickel plated to a thickness of 0.0025 mm. to give a satisfactory surface for brazing Kovar leads to the 2.5 mm. square pads.

These brazed leads are then pulled at right angles to the surface of the ceramic until removed either because of rupture of the lead, of the ceramic or of the bond of the metallization to the ceramic. The force attained at rupture is recorded in Newtons for each of 5 to 7 leads and the average calculated. The forces necessary for rupture in this example range between 11 and 18 Newtons. In this case, the range is duplicated on samples fired on successive days. Although there is sometimes considerable variation in the observed pull strength of leads, it is found that at levels at about 20% beryllia by weight in the screening ink, average pull strengths are consistently above 9 Newtons in day-to-day operations for an area of contact of 6.25 mm.$^2$, that is about 1.5 N/mm.$^2$. This is generally accepted as a reasonable minimum value for commercial applications. The value is only occasionally reached when glassy binders are used instead of beryllia.

The above general procedure is repeated using tungsten of the same type (designated W-1) with 5, 10 and 15 weight percent BeO, with a tungsten from the same source with average particle size 0.8 microns designated W-2 with 5, 10 and 20 weight percent BeO, molybdenum of average particle size 5.5 microns from M and R Refractory Metals Inc., designated Mo-1 with 5, 10, 20, 30 and 40 weight percent BeO and molybdenum of average particle size 1.5 microns from Sylvania Electric Co. designated Mo-2 with 5, 10 and 20 weight percent BeO. Firing temperatures are varied between 1500° and 1660° C. with soak times of 1 to 4 hours, heating rates 50° to 300° C. per hour. The dew point of the wet disassociated ammonia reducing atmosphere varies between 27° and 49° C. The electrical resistances of metallized connectors of a given length and section tend to be higher at higher BeO concentrations, particularly for tungsten patterns. The higher the resistivity, the more difficult the electroplating operation. Above 30% BeO by weight, pull strengths decrease sharply which together with high electrical resistivities, effectively limits the % by weight of BeO to about 30%. The ranges of forces to rupture, in Newtons, of all samples tested are shown in the following tabulation:

| Metal | W-1 | W-2 | Mo-1 | Mo-2 |
|---|---|---|---|---|
| % BeO | | | | |
| 5 | 4.5–24.5 | 2.5–13.5 | 4.5–13.5 | 4.5–18 |
| 10 | 6.7–24.5 | 4.9–29 | 4.5–13.5 | 2.5–13.5 |
| 15 | 4.5–20.0 | — | — | — |
| 20 | — | 6.7–18 | 8.9–26.7 | 8.9–44 |
| 30 | — | — | 6.7–24.5 | — |

A conventional metallizing composition, i.e., with glass binder, cofired in this manner gives substantially no strength.

A monolithic composite package of high purity beryllia is formed when metallizing patterns, conventionally used for a multilayer alumina composite, are screened on several green beryllia ceramic sheets using procedures described above. The several green beryllia ceramic sheets are laminated together to give a multilayer laminate and the individual units are cut or stamped out and fired. If desired, the laminate can be fired and separated into individual units thereafter, for example, by cutting with a laser beam.

What is claimed is:
1. A silk-screening ink for metallizing high purity green beryllia substrates and cofiring therewith comprising the pigment combination in percents by weight of 95–70 percent finely divided molybdenum or tungsten and 5 to 30 percent finely divided high purity beryllia said combination being thoroughly dispersed in a vehicle conventional for silk-screening and constituting 70 to 90% by weight of said silk-screening ink.

2. The silk-screening ink of claim 1 wherein beryllia constitutes 15 to 25% by weight of the pigment combination.

3. The silk-screening ink of claim 1 wherein the vehicle is a solution of ethyl cellulose in terpineol.

4. A process for the production of a high purity beryllia substrate comprising the steps of
  1. preparing a dispersion, in a vehicle conventional for silk-screening, of the combination of 5 to 30 percent by weight finely divided high purity beryllia and 95 to 70% of finely divided molybdenum or tungsten in an amount of 70 to 90% the total weight of the dispersion,
  2. screening a desired metallized pattern of said dispersion on a green beryllia substrate consisting essentially of organic binder and high purity beryllia and thereafter
  3. cofiring said pattern and said substrate in a reducing atmosphere to maturation at a temperature in the range of about 1500° to about 1660° C.

5. High purity metallized beryllia substrate for attachment of one or more electronic devices and dissipation of heat generated thereby produced by the process of claim 4.

6. Metallized high purity beryllia composite for attachment of one or more electronic devices and dissipation of heat generated thereby, having a monolithic structure formed by laminating at least two green beryllia substrates comprising high purity beryllia and having metallizing patterns screened thereon composed of 5 to 30% by weight of finely divided high purity beryllia and 95 to 70% by weight of finely divided molybdenum or tungsten whereby a multilayer laminate is obtained and thereafter in a desired sequence separating individual composites from said laminate and firing said laminate or said individual composites to maturation in a reducing atmosphere at a temperature in the range of about 1500° to about 1660° C.

* * * * *